(12) United States Patent
Wang et al.

(10) Patent No.: US 9,728,402 B2
(45) Date of Patent: Aug. 8, 2017

(54) FLOWABLE FILMS AND METHODS OF FORMING FLOWABLE FILMS

(71) Applicant: Taiwan Semiconductor Manufacturing Company, Ltd., Hsin-Chu (TW)

(72) Inventors: Kuan-Cheng Wang, Miaoli (TW); Chun-Hao Hsu, New Taipei (TW); Han-Ti Hsiaw, Zhubei (TW); Keng-Chu Lin, Ping-Tung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/832,565

(22) Filed: Aug. 21, 2015

(65) Prior Publication Data

US 2017/0053798 A1    Feb. 23, 2017

(51) Int. Cl.
*H01L 21/336* (2006.01)
*H01L 21/02* (2006.01)
*H01L 29/66* (2006.01)
*H01L 21/3105* (2006.01)

(52) U.S. Cl.
CPC .. *H01L 21/02348* (2013.01); *H01L 21/02164* (2013.01); *H01L 21/3105* (2013.01); *H01L 29/66795* (2013.01)

(58) Field of Classification Search
CPC ........... H01L 21/0217; H01L 21/02164; H01L 21/02225; H01L 21/02223; H01L 21/02252; H01L 21/02255; H01L 21/02337; H01L 21/02348; H01L 21/02356

See application file for complete search history.

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,449,942 B2 | 5/2013 | Liang et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |

(Continued)

*Primary Examiner* — Selim Ahmed
*Assistant Examiner* — Evan Clinton
(74) *Attorney, Agent, or Firm* — Slater Matsil, LLP

(57) ABSTRACT

An embodiment is a method including depositing a first flowable film over a substrate in a processing region, the first flowable film comprising silicon and nitrogen, curing the first flowable film in a first step at a first temperature with a first process gas and ultra-violet light, the first process gas including oxygen, curing the first flowable film in a second step at a second temperature with a second process gas and ultra-violet light, the second process gas being different than the first process gas, and annealing the cured first flowable film at a third temperature to convert the cured first flowable film into a silicon oxide film over the substrate.

20 Claims, 13 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 2009/0142935 A1* | 6/2009 | Fukuzawa ............ C23C 16/345 438/792 |
| 2012/0036732 A1* | 2/2012 | Varadarajan ...... H01L 21/02164 34/276 |
| 2014/0001574 A1 | 1/2014 | Chen et al. |
| 2014/0110755 A1 | 4/2014 | Colinge |
| 2014/0151812 A1 | 6/2014 | Liaw |
| 2014/0306297 A1* | 10/2014 | Ching ............... H01L 29/66795 257/401 |

* cited by examiner

FLOWABLE FILMS AND METHODS OF FORMING FLOWABLE FILMS

BACKGROUND

Generally, shallow trench isolations (STIs) are used to separate and isolate active areas on a semiconductor wafer from each other. These STIs have historically been formed by etching trenches, sometimes referred to as gaps, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

However, as circuit densities continue to increase, the widths of these gaps decrease, thereby increasing gap aspect ratios, which are typically defined as the gap height divided by the gap width. As a result, it is very difficult to fill these narrow and deep gaps completely with a gap-fill dielectric material. Incomplete filling results in unwanted voids and discontinuities in the gap-fill dielectric material as well as inclusion of unwanted material. These voids and inclusions result in inadequate isolation between active areas. Electrical performance of a device with inadequate isolation is poor and device yield is reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
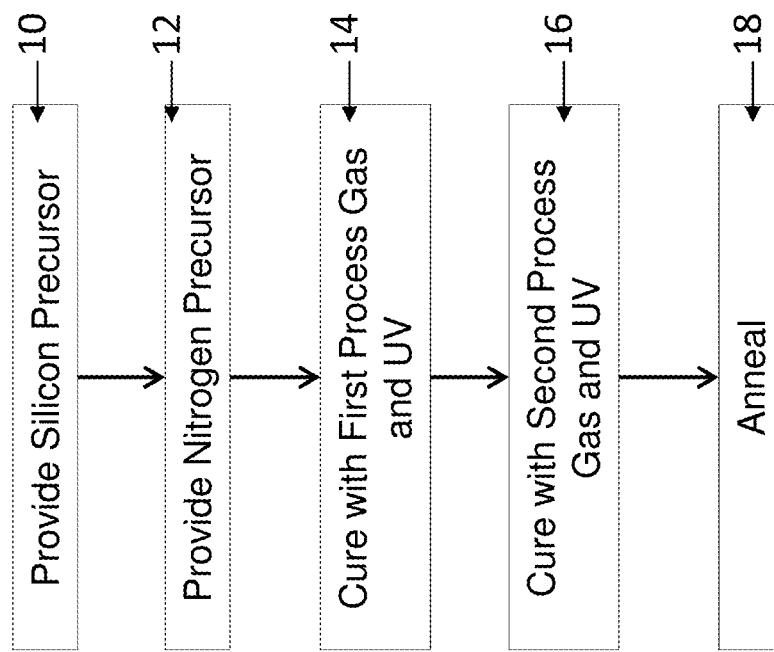
FIG. 1 is a process flow of a process of forming a flowable film in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As transistor sizes decrease, the size of each feature decreases. One such feature is the shallow trench isolation (STI) used between active areas to isolate one semiconductor device from another and another is the inter-layer dielectric (ILD) between gate structures. Feature size reduction often results in increased aspect ratios because the widths of the openings are smaller but the depths are often the same as before. Techniques used to fill openings (e.g. STIs in substrates or ILDs between gate structures) having lower aspect ratios cannot typically be used to adequately fill openings of advanced technologies having high aspect ratios, such as aspect ratios of 8:1 or more. In many chemical vapor deposition (CVD) processes, a plasma is used with silicon-containing precursors and oxygen-containing gas to form silicon oxide directly on the surface of the opening. These plasma-based CVD processes forms silicon oxide as deposited; however, they fill poorly for high aspect ratio gaps.

One alternative to improve filling pertains to using flowable dielectric materials instead of conventional silicon oxide as deposited. Flowable dielectric materials, as their name suggest, can flow to fill voids in a gap. Usually, various chemistries are added to the silicon-containing precursors to allow the deposited film to flow. In some examples, nitrogen hydride bonds are added. After the flowable film is deposited, it is cured and then annealed to remove the added chemistry to form silicon oxide. When the added chemistry is removed, the flowable film densifies and shrinks. The flowable film is cured and annealed at a high temperature, up to 1200 degrees Celsius, and for a long time, for a total of 30 hours or more. The cure and anneal significantly reduces the thermal budget allowed for the rest of the semiconductor manufacturing process. Further, even with the high temperature cure and anneal processes, mechanical properties, such as a wet etch rate, of the flowable film varies with film depth.

Various aspects of the present disclosure pertain to structure and method for forming flowable films with lower temperature cure and anneal processes while improving the mechanical properties (e.g. wet etch rate) of the flowable films.

FIG. 1 is a process flow of a process of forming a flowable film with a flowable chemical vapor deposition (FCVD) process in accordance with some embodiments. The process begins with the providing a silicon-containing precursor to a processing region, such as a processing chamber with a substrate/wafer present (step 10). In some embodiments, the silicon-containing precursor is a polysilazane. Polysilazanes are polymers having a basic structure composed of silicon and nitrogen atoms in an alternating sequence.

In polysilazanes, each silicon atom is usually bound to two nitrogen atoms, or each nitrogen atom is bound to two silicon atoms, so that these can be described predominantly as molecular chains of the formula $[R_1R_2Si-NR_3]_n$. R1-R3 can be hydrogen atoms or organic substituents. When only hydrogen atoms are present as substituents, the polymers are referred to as perhydropolysilazanes $[H_2Si-NH]_n$. If organic substituents are bound to silicon and/or nitrogen, the compounds are referred to as organopolysilazanes.

In some embodiments, the silicon-containing precursor is a silylamine, such as trisilylamine (TSA), disilylamine (DSA), or a combination thereof. One or more carrier gases may also be included with the silicon-containing precursor. The carrier gases may include helium, argon, nitrogen ($N_2$), the like, or a combination thereof.

Next, a nitrogen-containing precursor is provided to the processing region (step 12). In some embodiments, the nitrogen-containing precursor includes $NH_3$, $N_2$, the like, or a combination thereof. In some embodiments, the nitrogen-containing precursor is activated in a remote plasma system (RPS) outside of the processing region and transported into the processing region. An oxygen source gas, such as $O_2$ or the like may be included with the nitrogen-containing precursor. In addition, a carrier gas such $H_2$, $N_2$, He, the like, or a combination thereof may be included with the nitrogen-containing precursor.

In the processing region, the silicon-containing precursor and the nitrogen-containing precursor mix and react to deposit a film containing silicon and nitrogen on the deposition substrate/wafer present in the processing region. In some embodiments, the deposited film has flowable characteristics. The flowable nature of the formation allows the film to flow into narrow gaps trenches and other structures on the deposition surface of the substrate/wafer.

Following the deposition of the film containing silicon and nitrogen, the film may be cured in two-step ultra-violet (UV) assisted curing process (steps 14 and 16). In some embodiments, one or both of the steps of the two-step UV assisted curing process includes curing the film in an oxygen-containing atmosphere. The curing process may increase the concentration of oxygen in the film while reducing the concentration of nitrogen and hydrogen in the film. The wafer/substrate may be moved to a different region/chamber with a UV light source (e.g. UV lamp) or, in some embodiments, the current processing region may include a UV light source.

In an embodiment, the first step (step 14) of the two-step UV assisted curing process includes providing an oxygen-containing gas, such as $O_2$, $O_3$, the like, or a combination thereof and a high thermal conductive gas, such as He, Ar, the like, or a combination thereof to the flowable film on the wafer/substrate. In this embodiment, the first step of the curing process has a curing temperature of less than 100° C. The curing process may be assisted with a full spectrum (e.g. about 200 nm to about 1000 nm) UV light source. The first step of the curing process may be performed for a duration of about 1 minute to about 10 minutes.

In an embodiment, the second step (step 16) of the two-step UV assisted curing process includes providing a high thermal conductive carrier gas, such as He, Ar, the like, or a combination thereof to the flowable film on the wafer/substrate. In this embodiment, the second step of the curing process has a curing temperature of less than 100° C. and may be assisted with a full spectrum UV light source. The second step of the curing process may be performed for a duration of about 1 minute to about 10 minutes.

The utilization of the UV light source during the two curing steps of the flowable film helps to cause more Si—Si and Si—O crosslinking, which increases the mechanical properties of the flowable film. The UV light source achieves this by assisting in breaking of Si—N bonds and Si—H bonds to form Si—Si bonds and Si—O bonds. By having the mechanical properties of the flowable film improved during the curing process and before the thermal anneal process, the subsequent thermal anneal process can utilize a lower temperature, which allows for a higher thermal budget for the rest of the semiconductor manufacturing process.

In another embodiment, the first step of the two-step UV assisted curing process is similar to the embodiment described above except that the UV light source utilized is partial spectrum and not full spectrum. In this embodiment, the first step uses a UV light source with wavelengths from about 300 nm to about 600 nm. This embodiment may utilize a coated window filter, such as a gold coated window, to filter out the wavelengths of the UV light outside of the desired wavelength range. This 300 nm to 600 nm UV curing process is an appropriate wavelength range to create the most dangling Si bonds and to transform them to Si—Si and Si—O bonds. In an embodiment, a transmission percentage of the UV light with wavelengths from about 300 nm to about 600 nm is more than about 85% of the total UV transmission and the transmission percentage of UV light with wavelengths outside of this range is less than about 5% of the total UV transmission.

In this embodiment, the second step of the two-step UV assisted curing process is similar to the embodiment described above except that the UV light source utilized is partial spectrum and not full spectrum. In this embodiment, the second step uses a UV light source with wavelengths of less than 400 nm. This embodiment may utilize a coated window filter, such as a gold coated window, to filter out the wavelengths of the UV light outside of the desired wavelength range. This less than 400 nm UV curing process is an appropriate wavelength range to further help Si—O network crosslinking. In an embodiment, a transmission percentage of the UV light with wavelengths less than about 400 nm is more than about 85% of the total UV transmission and the transmission percentage of UV light with wavelengths outside of this range is less than about 5% of the total UV transmission. As discussed above, the increased S—O crosslinking improves the mechanical properties, such as the wet etch rate, of the film.

The curing process is followed by an annealing process (step 18). In some embodiments, the annealing process may be performed at temperatures less than 600° C. The annealing process may be either a wet or dry anneal. The annealing process may be performed for a duration of about 1 hour to about 10 hours. In some embodiments, the curing processes and the anneal process converts the deposited film containing silicon and nitrogen into a silicon oxide film. In an embodiment, after the curing processes and the anneal process, the film consists essentially of silicon and oxygen.

As discussed above, the two-step UV assisted curing process improves the mechanical properties of the film before the anneal process. By having the mechanical properties of the flowable film improved after the curing process, the subsequent thermal anneal process can utilize a lower temperature, which allows for a higher thermal budget for the rest of the semiconductor manufacturing process. For example, it has been found that the disclosed process improves the wet etch rate of a hydrofluoric acid dip process by more than 10%. This improvement in the wet etch rate is both a more controlled wet etch rate and less variance with film depth of the wet etch rate.

The above disclosed FCVD method of forming flowable films can be utilized in forming shallow trench isolation (STI) regions and/or inter-layer dielectrics (ILDs) in Metal-Oxide-Semiconductor Field-Effect Transistors (MOSFETs), such as Fin Field-Effect Transistors (FinFETs) or other semiconductor devices.

FinFETs and methods of forming the same are provided in accordance with various embodiments. Intermediate stages of forming FinFETs are illustrated. Some embodiments discussed herein are discussed in the context of FinFETs formed using a gate-last process. In other embodiments, a gate-first process may be used. Also, some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Figure 2:
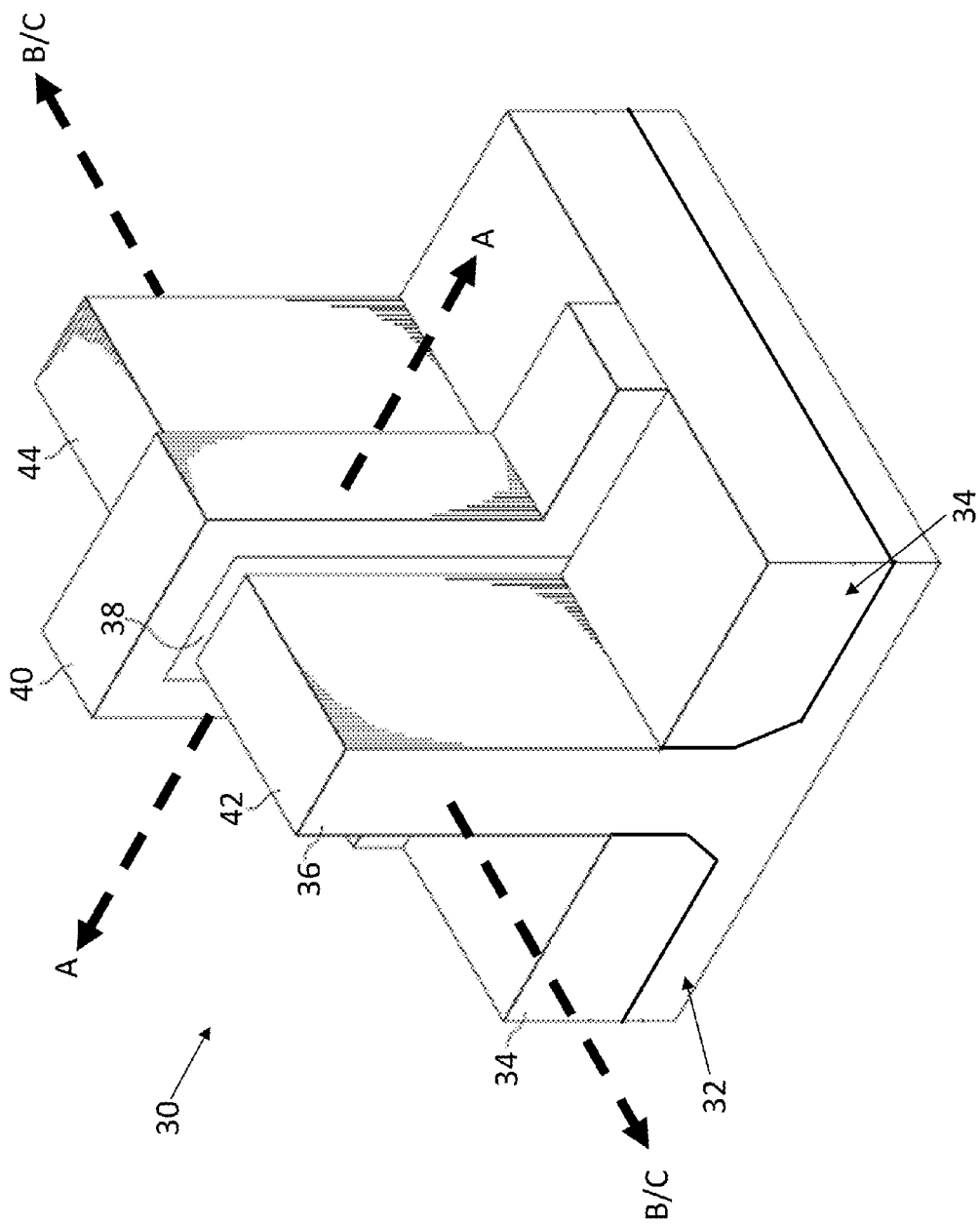
FIG. 2 is an example of a Fin Field-Effect Transistor (FinFET) in a three-dimensional view.

FIG. 2 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 2 further illustrates reference cross-sections that are used in later figures. Cross-section A-A is across a channel, gate dielectric 38, and gate electrode 40 of the FinFET 30. Cross-section B/C-B/C is perpendicular to cross-section A-A and is along a longitudinal axis of the fin 36 and in a direction of, for example, a current flow between the source/drain regions 42 and 44. Subsequent figures refer to these reference cross-sections for clarity.

Figure 15A:
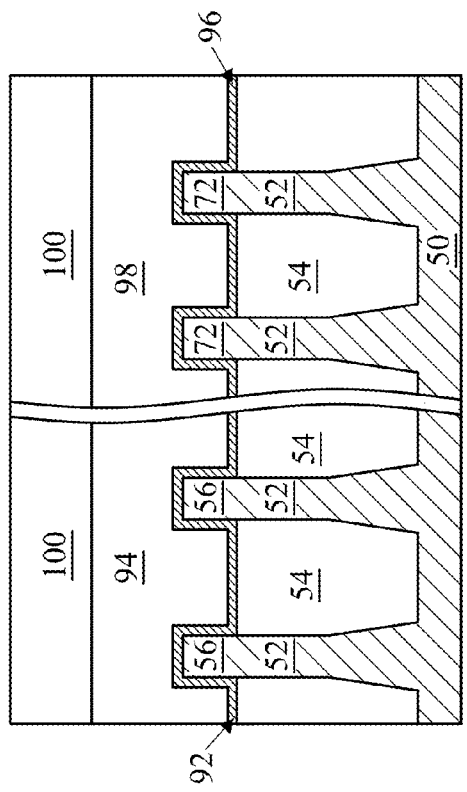
Figure 15B:
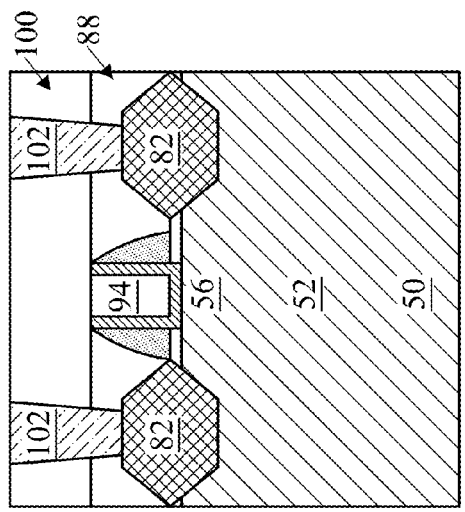
Figure 15C:
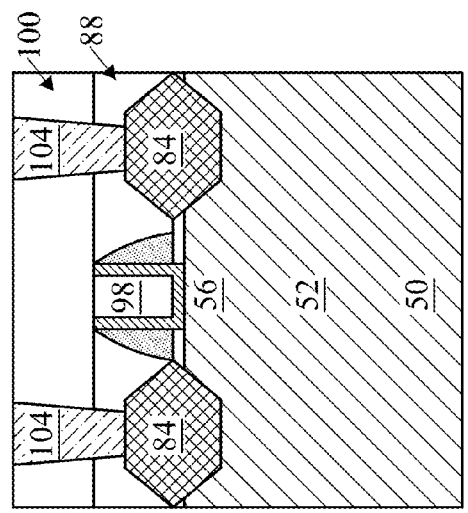
Figure 16:
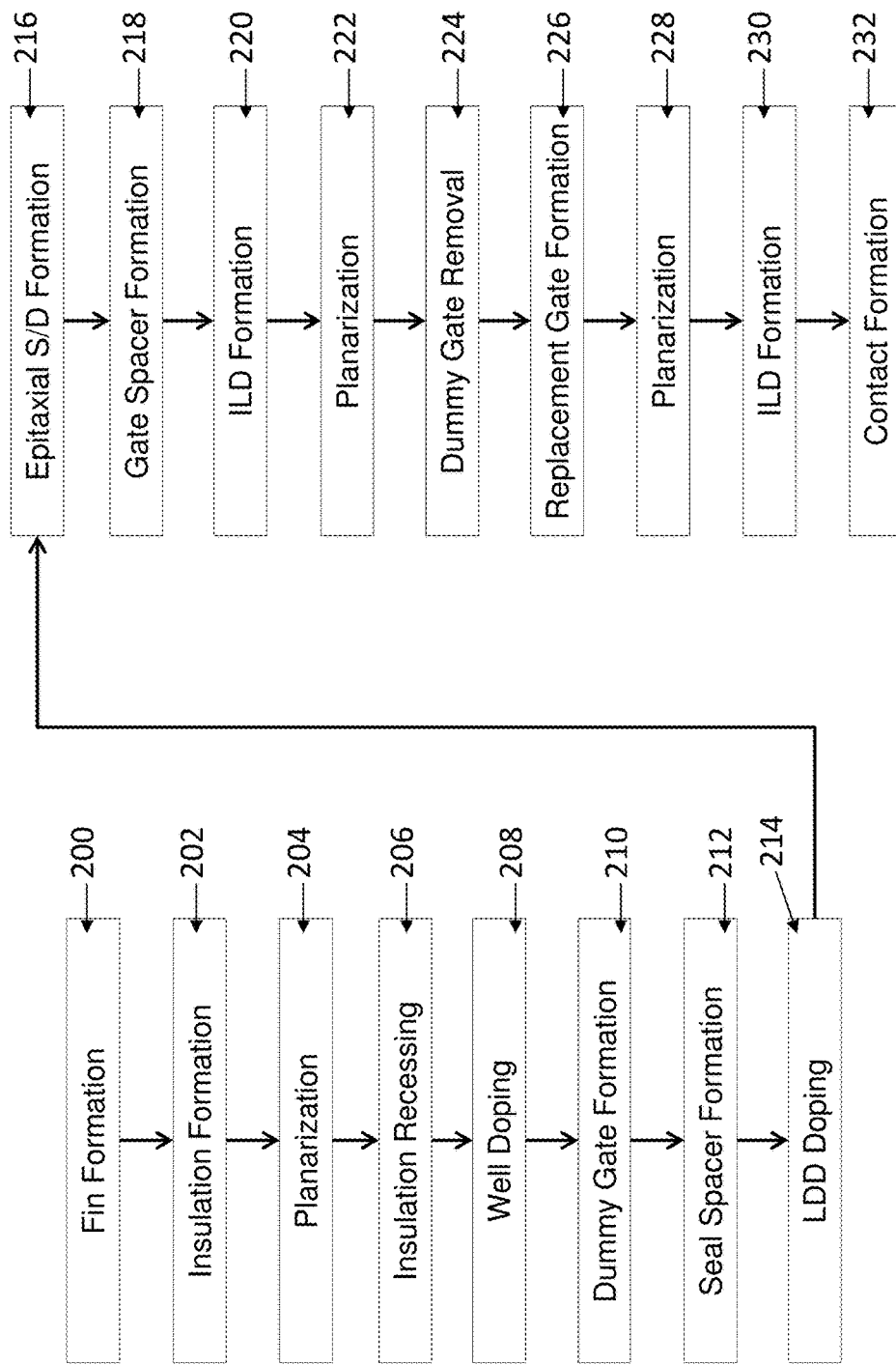
FIG. 16 is a process flow of a process of in accordance with some embodiments.

FIGS. 3 through 15C are cross-sectional views of intermediate stages in the manufacturing of FinFETs in accordance with an exemplary embodiment, and FIG. 16 is a process flow of the process shown in FIGS. 3 through 15C. FIGS. 2 through 7 illustrate reference cross-section A-A illustrated in FIG. 2, except for multiple FinFETs. In FIGS. 8A through 15C, figures ending with an "A" designation are illustrated along a similar cross-section A-A; figures ending with a "B" designation are illustrated along a similar cross-section B/C-B/C and in a first region on a substrate; and figures ending with a "C" designation are illustrated along a similar cross-section B/C-B/C and in a second region on a substrate.

Figure 3:
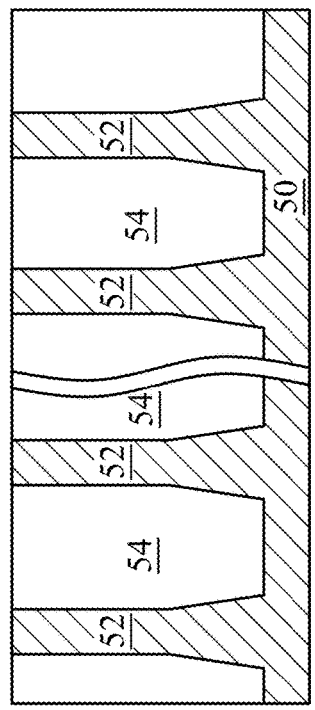
FIGS. 3 through 7, 8A-8C, 9A-9C, 10A-10C, 11A-11C, 12A-12C, 13A-13C, 14A-14C, and 15A-15C are cross-sectional views of intermediate stages in the manufacturing of FinFETs in accordance with some embodiments.

FIG. 3 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B (which corresponds to subsequent figures ending in "B") can be for forming n-type devices, such as NMOS transistors, such as n-type FinFETs. The second region 50C (which corresponds to subsequent figures ending in "C") can be for forming p-type devices, such as PMOS transistors, such as p-type FinFETs.

Figure 5:
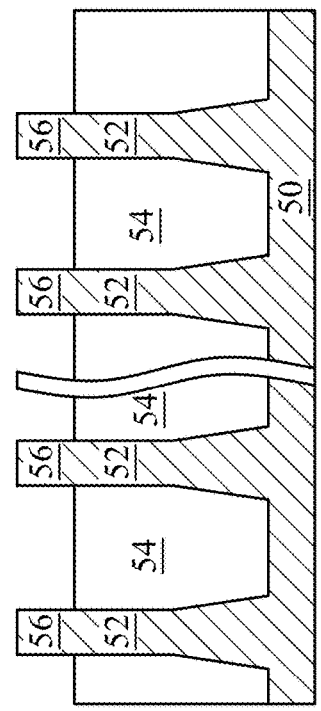
Figure 4:
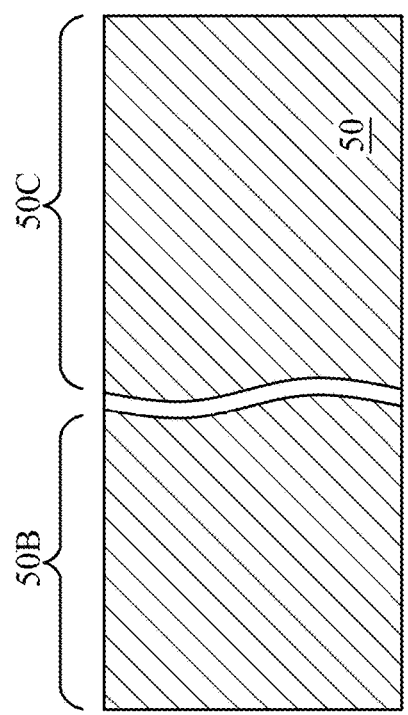

FIGS. 4 and 5 illustrate the formation of fins 52 and isolation regions 54 between neighboring fins 52. In FIG. 4 and in step 200, fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

In FIG. 5 and step 202, an insulation material 54 is formed between neighboring fins 52 to form the isolation regions 54. The insulation material 54 may be an oxide, such as silicon oxide, a nitride, the like, or a combination thereof. In an embodiment, the insulation material 54 is a flowable film formed by the FCVD method described above in FIG. 1 and corresponding paragraphs. In some embodiments, the insulation material 54 may be formed by a high density plasma chemical vapor deposition (HDP-CVD), the like, or a combination thereof. Other insulation materials formed by any acceptable process may be used. In the illustrated embodiment, the insulation material 54 is silicon oxide formed by the FCVD process of FIG. 1. An anneal process may be performed once the insulation material is formed. The insulating material 54 may be referred to as isolation regions 54. Further in FIG. 5 and in step 204, a planarization process, such as a chemical mechanical polish (CMP), may remove any excess insulation material 54 and form top surfaces of the isolation regions 54 and top surfaces of the fins 52 that are coplanar.

Figure 6:
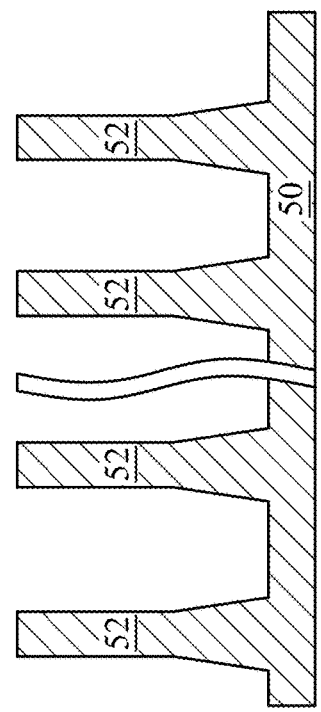

In FIG. 6 and step 206, the isolation regions 54 are recessed, such as to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 3 through 6 is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 52 in FIG. 5 can be recessed, and a material different from the semiconductor strips 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In FIG. 6 and step 208, appropriate wells may be formed in the fins 56, fins 52, and/or substrate 50. For example, a P well may be formed in the first region 50B, and an N well may be formed in the second region 50C.

The different implant steps for the different regions 50B and 50C may be achieved using a photoresist or other masks (not shown). For example, a photoresist is formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region, such as the PMOS region. The p-type impurities may be boron, $BF_2$, or the like implanted in the first region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the first region 50B and the second region 50C, an anneal may be performed to activate the p-type and n-type impurities that were implanted. The implantations may form a p-well in the first region 50B, e.g., the NMOS region, and an n-well in the second region 50C, e.g., the PMOS region. In some embodiments, the grown materials of epitaxial fins may be in situ doped during growth, which may obviate the implantations, although in situ and implantation doping may be used together.

Figure 7:
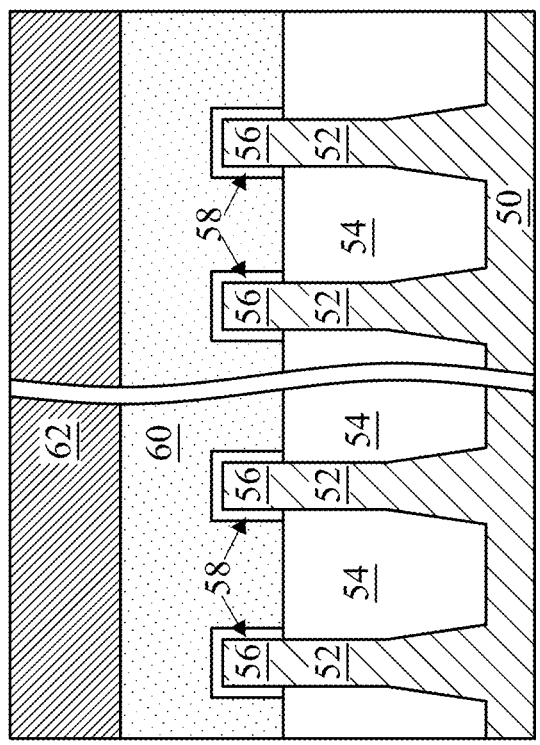

In FIG. 7 and step 210, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60.

The dummy gate layer 60 may be deposited over the dummy dielectric layer 58 and then planarized, such as by a CMP. The mask layer 62 may be deposited over the dummy gate layer 60. The dummy gate layer 60 may be made of, for example, polysilicon, although other materials that have a high etching selectivity from the etching of isolation regions 54 may also be used. The mask layer 62 may include, for example, silicon nitride or the like. In this example, a single dummy gate layer 60 and a single mask layer 62 are formed across the first region 50B and the second region 50C. In other embodiments, separate dummy gate layers may be formed in the first region 50B and the second region 50C, and separate mask layers may be formed in the first region 50B and the second region 50C.

Figure 8A:
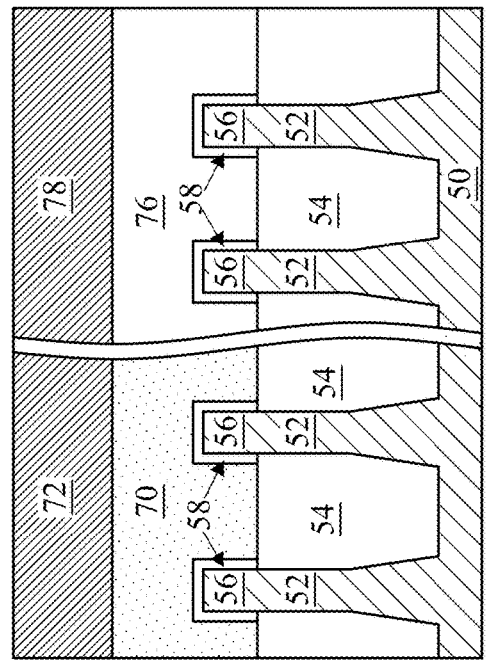
Figure 8B:
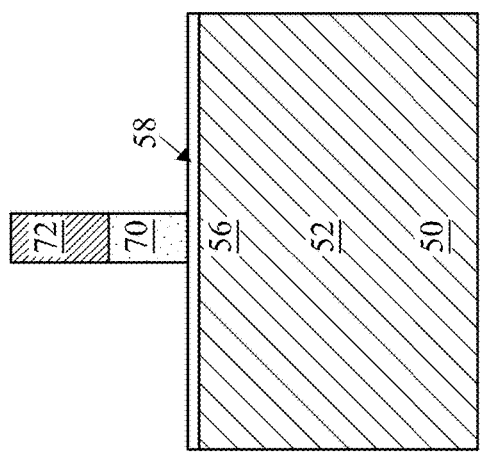
Figure 8C:
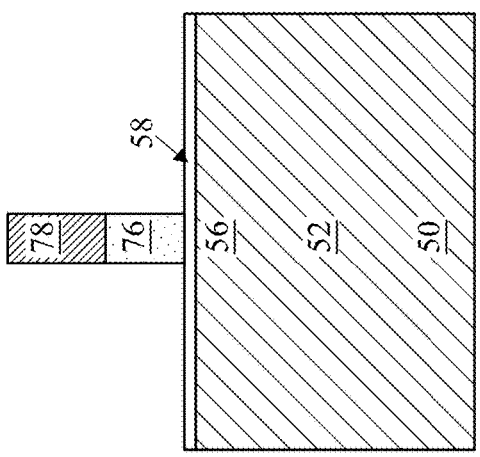

In FIGS. 8A, 8B, and 8C and continuing in step 210, the mask layer 62 may be patterned using acceptable photolithography and etching techniques to form masks 72 in the first region 50B (as illustrated in FIG. 8B) and masks 78 in the second region 50C (as illustrated in FIG. 8C). The pattern of the masks 72 and 78 then may be transferred to the dummy gate layer 60 and dummy dielectric layer 58 by an acceptable etching technique to form dummy gates 70 in the first region 50B and dummy gates 76 in the second region 50C. The dummy gates 70 and 76 cover respective channel regions of the fins 56. The dummy gates 70 and 76 may also have a lengthwise direction substantially perpendicular to the lengthwise direction of respective epitaxial fins.

Figure 9A:
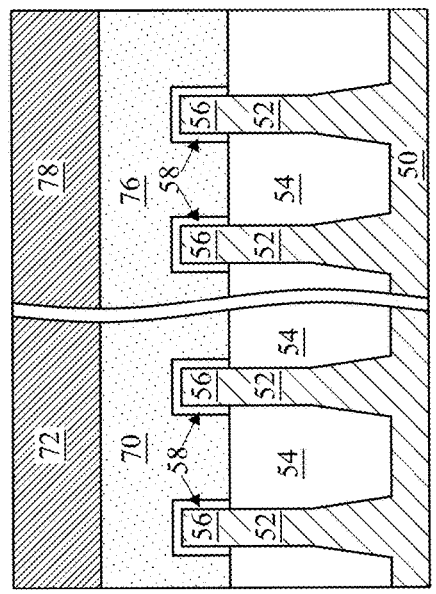
Figure 9B:
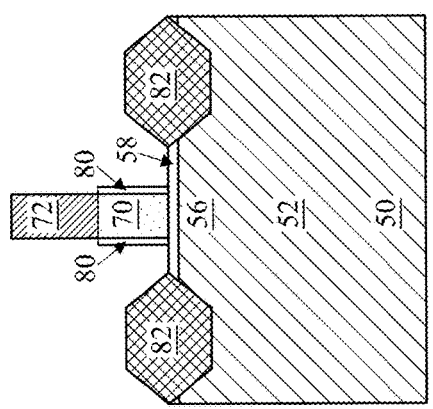
Figure 9C:
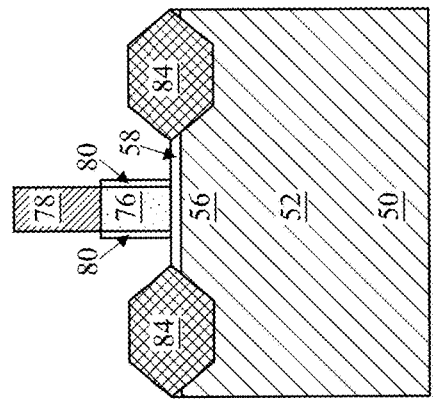

In FIGS. 9A, 9B, and 9C and step 212, gate seal spacers 80 can be formed on exposed surfaces of respective dummy gates 70 and 76 and/or fins 56. A thermal oxidation or a deposition followed by an anisotropic etch may form the gate seal spacers 80.

In step 214, implants for lightly doped source/drain (LDD) regions may be performed. Similar to the implants discussed above in FIG. 6, a mask, such as a photoresist, may be formed over the first region 50B, e.g., NMOS region, while exposing the second region 50C, e.g., PMOS region, and p-type impurities may be implanted into the exposed fins 56 in the second region 50C. The mask may then be removed. Subsequently, a mask, such as a photoresist, may be formed over the second region 50C while exposing the first region 50B, and n-type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ $cm^{-3}$ to about $10^{16}$ $cm^{-3}$. An anneal may be used to activate the implanted impurities.

Further in FIGS. 9A, 9B, and 9C and in step 216, epitaxial source/drain regions 82 and 84 are formed in the fins 56. In the first region 50B, epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52. In the second region 50C, epitaxial source/drain regions 84 are formed in the fins 56 such that each dummy gate 76 is disposed between respective neighboring pairs of the epitaxial source/drain regions 84. In some embodiments that epitaxial source/drain regions 84 may extend into the fins 52.

Epitaxial source/drain regions 82 in the first region 50B, e.g., the NMOS region, may be formed by masking the second region 50C, e.g., the PMOS region, and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. The epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. Subsequently, the dummy gate spacers in the first region 50B are removed, for example, by an etch, as is the mask on the second region 50C.

Epitaxial source/drain regions 84 in the second region 50C, e.g., the PMOS region, may be formed by masking the first region 50B, e.g., the NMOS region, and conformally depositing a dummy spacer layer in the second region 50C followed by an anisotropic etch to form dummy gate spacers (not shown) along sidewalls of the dummy gates 76 and/or gate seal spacers 80 in the second region 50C. Then, source/drain regions of the epitaxial fins in the second region 50C are etched to form recesses. The epitaxial source/drain regions 84 in the second region 50C are epitaxially grown in the recesses. The epitaxial source/drain regions 84 may include any acceptable material, such as appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. Subsequently, the dummy gate spacers in the second region 50C are removed, for example, by an etch, as is the mask on the first region 50B.

Figure 10A:
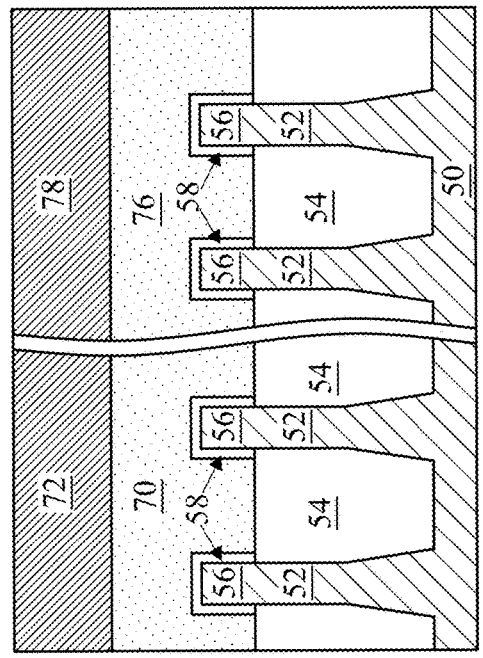
Figure 10B:
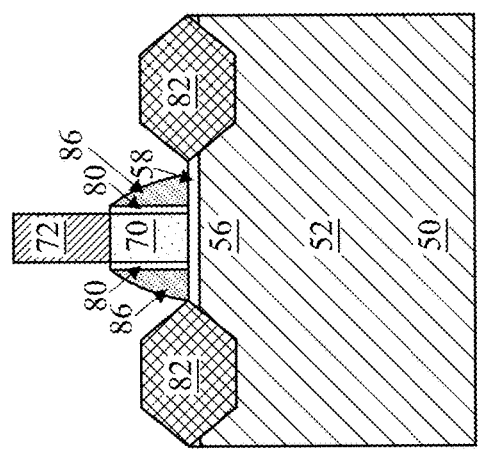
Figure 10C:
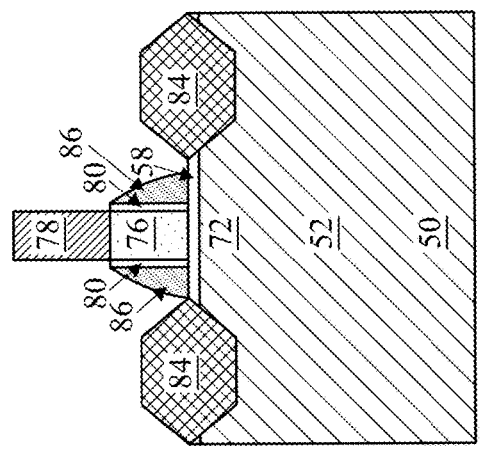

In FIGS. 10A, 10B, and 10C and step 218, gate spacers 86 are formed on the gate seal spacers 80 along sidewalls of the dummy gates 70 and 76. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and 84 and/or epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type impurities for source/drain regions in the first region 50B, e.g., the NMOS region, may be any of the n-type impurities previously discussed, and the p-type impurities for source/drain regions in the second region 50C, e.g., the PMOS region, may be any of the p-type impurities previously discussed. In other embodiments, the epitaxial source/drain regions 82 and 84 may be in situ doped during growth.

Figure 11A:
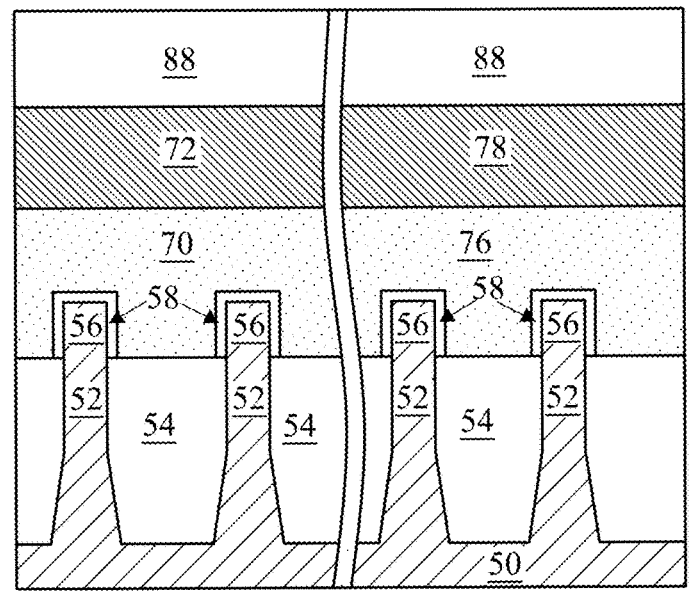
Figure 11B:
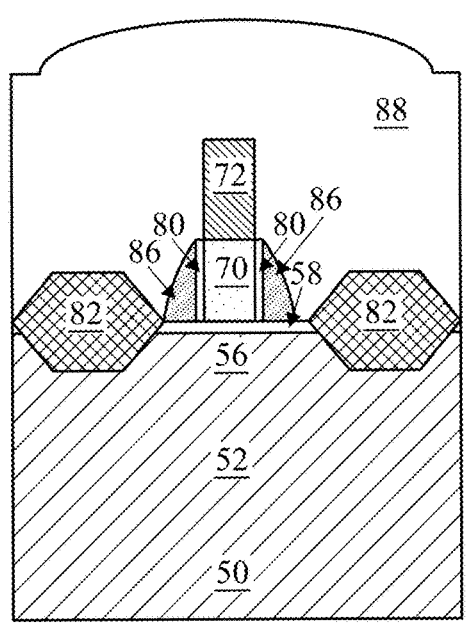
Figure 11C:
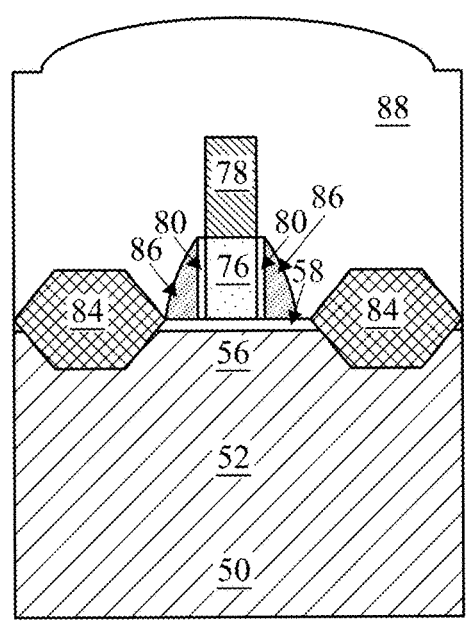

In FIGS. 11A, 11B, and 11C and step 220, an ILD 88 is deposited over the structure illustrated in FIGS. 10A, 10B, and 10C. In an embodiment, the ILD 88 is a flowable film formed by the FCVD method described above in FIG. 1 and corresponding paragraphs. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as chemical vapor deposition (CVD), or plasma-enhanced CVD (PECVD).

Figure 12A:
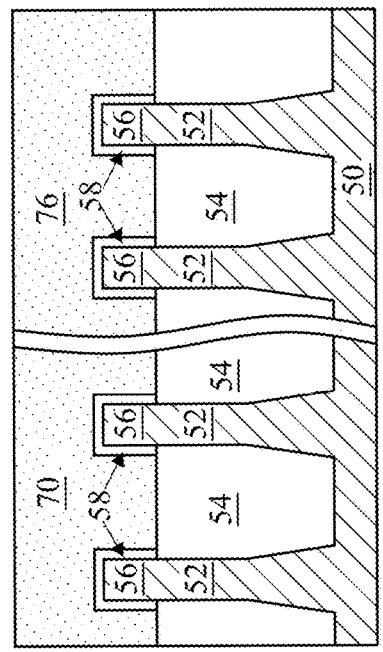
Figure 12B:
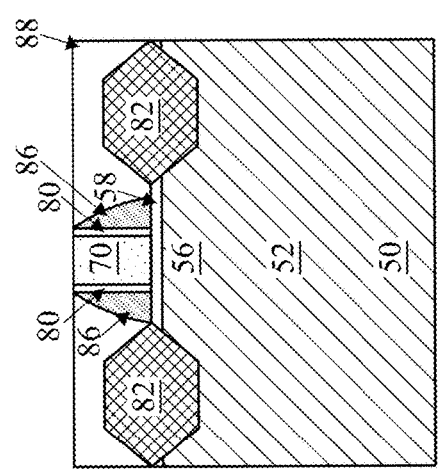
Figure 12C:
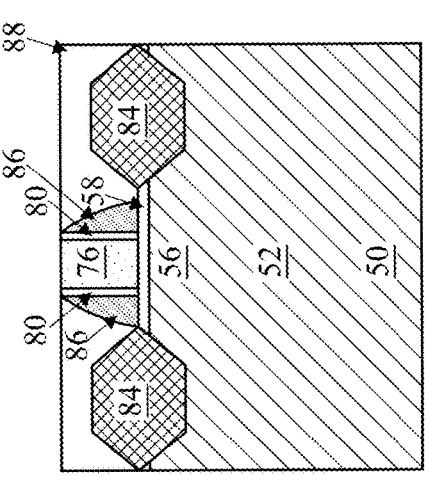

In FIGS. 12A, 12B, and 12C and step 222, a planarization process, such as a CMP, may be performed to level the top surface of ILD 88 with the top surfaces of the dummy gates 70 and 76. The CMP may also remove the masks 72 and 78 on the dummy gates 70 and 76. Accordingly, top surfaces of the dummy gates 70 and 76 are exposed through the ILD 88.

Figure 13A:
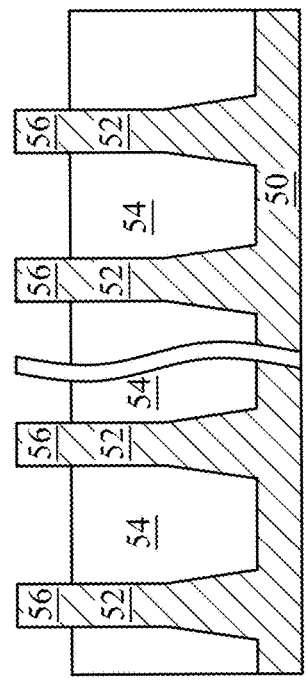
Figure 13B:
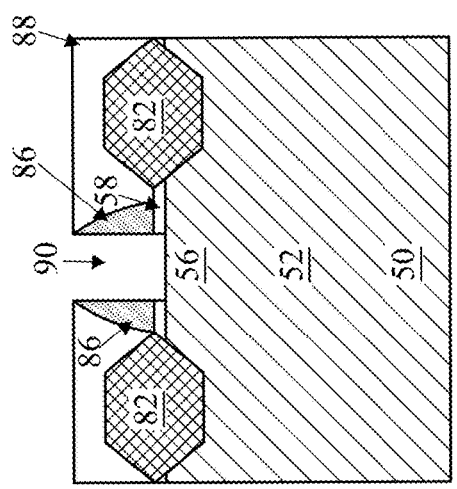
Figure 13C:
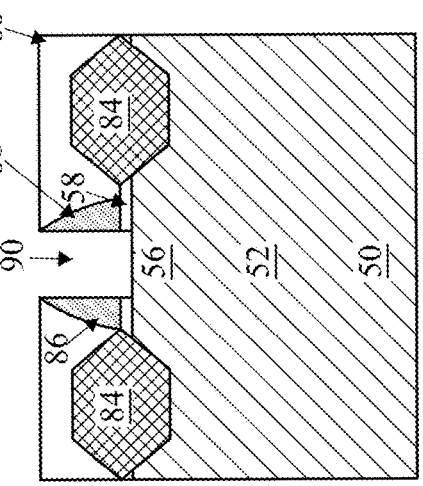

In FIGS. 13A, 13B, and 13C and step 224, the dummy gates 70 and 76, gate seal spacers 80, and portions of the dummy dielectric layer 58 directly underlying the dummy gates 70 and 76 are removed in an etching step(s), so that recesses 90 are formed. Each recess 90 exposes a channel region of a respective fin 56. Each channel region is disposed between neighboring pairs of epitaxial source/drain regions 82 and 84. During the removal, the dummy dielectric layer 58 may be used as an etch stop layer when the dummy gates 70 and 76 are etched. The dummy dielectric layer 58 and gate seal spacers 80 may then be removed after the removal of the dummy gates 70 and 76.

Figure 14A:
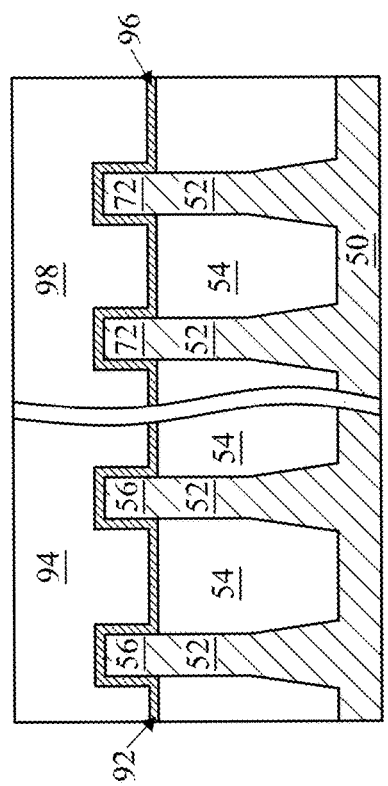
Figure 14B:
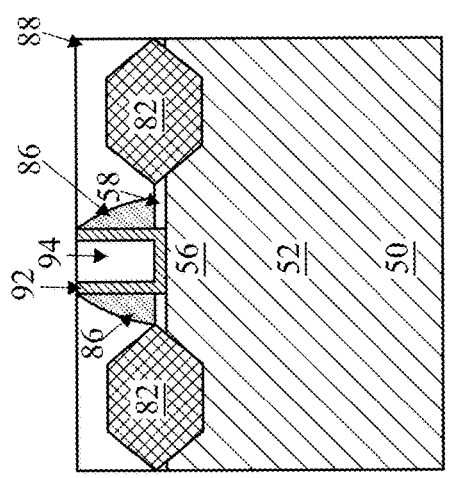
Figure 14C:
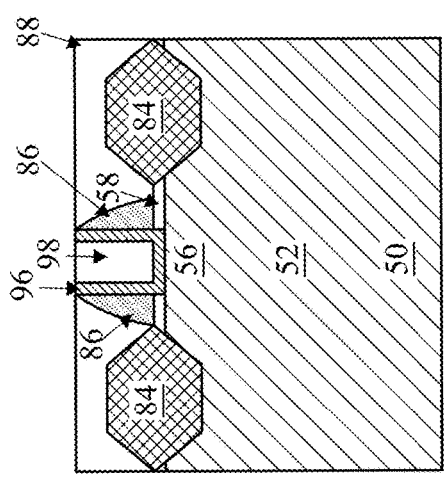

In FIGS. 14A, 14B, and 14C and step 226, gate dielectric layers 92 and 96 and gate electrodes 94 and 98 are formed for replacement gates. Gate dielectric layers 92 and 96 are deposited conformally in recesses 90, such as on the top surfaces and the sidewalls of the fins 56 and on sidewalls of the gate spacers 86, and on a top surface of the ILD 88. In accordance with some embodiments, gate dielectric layers 92 and 96 comprise silicon oxide, silicon nitride, or multi-layers thereof. In other embodiments, gate dielectric layers 92 and 96 include a high-k dielectric material, and in these embodiments, gate dielectric layers 92 and 96 may have a k value greater than about 7.0, and may include a metal oxide or a silicate of Hf, Al, Zr, La, Mg, Ba, Ti, Pb, and combinations thereof. The formation methods of gate dielectric layers 92 and 96 may include Molecular-Beam Deposition (MBD), Atomic Layer Deposition (ALD), PECVD, and the like.

Next, gate electrodes 94 and 98 are deposited over gate dielectric layers 92 and 96, respectively, and fill the remaining portions of the recesses 90. Gate electrodes 94 and 98 may be made of a metal-containing material such as TiN, TaN, TaC, Co, Ru, Al, combinations thereof, or multi-layers thereof. After the filling of gate electrodes 94 and 98, in step 228, a planarization process, such as a CMP, may be performed to remove the excess portions of gate dielectric layers 92 and 96 and the material of gate electrodes 94 and 98, which excess portions are over the top surface of ILD 88. The resulting remaining portions of material of gate electrodes 94 and 98 and gate dielectric layers 92 and 96 thus form replacement gates of the resulting FinFETs.

The formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

In FIGS. 15A, 15B, and 15C, an ILD 100 is deposited over ILD 88 in step 230, and contacts 102 and 104 are formed through ILD 100 and ILD 88 in step 232. In an embodiment, the ILD 100 is a flowable film formed by the FCVD method described above in FIG. 1 and corresponding paragraphs. In some embodiments, the ILD 100 is formed of a dielectric material such as PSG, BSG, BPSG, USG, or the like, and may be deposited by any suitable method, such as CVD and PECVD. Openings for contacts 102 and 104 are formed through the ILDs 88 and 100. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form contacts 102 and 104 in the openings. An anneal process may be performed to form a silicide at the interface between the epitaxial source/drain regions 82 and 84 and the contacts 102 and 104, respectively. Contacts 102 are physically and electrically coupled to the epitaxial source/drain regions 82, and contacts 104 are physically and electrically coupled to the epitaxial source/drain regions 84.

Although not explicitly shown, a person having ordinary skill in the art will readily understand that further processing steps may be performed on the structure in FIGS. 15A, 15B, and 15C. For example, various Inter-Metal Dielectrics (IMD) and their corresponding metallizations may be formed over ILD 100.

Embodiments may achieve advantages. For example, the utilization of the UV light source during the two curing steps of the flowable film helps to cause more Si—Si and Si—O crosslinking, which increases the mechanical properties of the flowable film. The UV light source achieves this by assisting in breaking of S—N bonds and S—H bonds to form Si—Si bonds and Si—O bonds. By having the mechanical properties of the flowable film improved during the curing process and before the thermal anneal process, the subsequent thermal anneal process can utilize a lower temperature, which allows for a higher thermal budget for the rest of the semiconductor manufacturing process. By having the mechanical properties of the flowable film improved after the curing process, the subsequent thermal anneal process can utilize a lower temperature, which allows for a higher thermal budget for the rest of the semiconductor manufacturing process. For example, it has been found that the disclosed process improves the wet etch rate of a hydrofluoric acid dip process by more than 10%. This improvement in the wet etch rate is both a more controlled wet etch rate and less variance with film depth of the wet etch rate.

An embodiment is a method including depositing a first flowable film over a substrate in a processing region, the first flowable film comprising silicon and nitrogen, curing the first flowable film in a first step at a first temperature with a first process gas and ultra-violet light, the first process gas including oxygen, curing the first flowable film in a second step at a second temperature with a second process gas and ultra-violet light, the second process gas being different than the first process gas, and annealing the cured first flowable film at a third temperature to convert the cured first flowable film into a silicon oxide film over the substrate.

Another embodiment is a method including forming a semiconductor fin on a substrate and forming an isolation region on the substrate, the isolation region surrounding the semiconductor fin. Forming the isolation region further including depositing a first flowable film over the substrate, curing the first flowable film in two step curing process with both curing steps including ultra-violet light, and annealing the cured first flowable film at a first temperature to convert the cured first flowable film into the isolation region over the substrate.

A further embodiment is a method including forming a semiconductor fin on a substrate and forming an isolation region on the substrate, the isolation region including a silicon oxide film and surrounding the semiconductor fin. Forming the isolation region further includes depositing a first flowable film over a substrate in a processing region, the first flowable film comprising silicon and nitrogen, curing the first flowable film in a first step at a curing temperature less than 100° C. with a first process gas and ultra-violet light, the first process gas including oxygen, curing the first flowable film in a second step at a curing temperature less than 100° C. with a second process gas and ultra-violet light, the second process gas including argon, helium, or a combination thereof, and annealing the cured first flowable film at an annealing temperature less than less than 600° C. to convert the cured first flowable film into the silicon oxide film. The method further including forming a gate dielectric on a top surface and sidewalls of the semiconductor fin and a top surface of the isolation region, forming a gate electrode on the gate dielectric, and forming a source region and a drain region in the semiconductor fin, the gate electrode being interposed between the source region and the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first flowable film over a substrate in a processing region, the first flowable film comprising silicon and nitrogen;
   curing the first flowable film in a first operation at a first temperature with a first process gas and ultra-violet light, the first process gas comprising oxygen, the first temperature being less than 100° C.;
   curing the first flowable film in a second operation at a second temperature with a second process gas and ultra-violet light, the second process gas being different than the first process gas, the second temperature being less than 100° C.; and
   annealing the cured first flowable film at a third temperature to convert the cured first flowable film into a silicon oxide film over the substrate.

2. The method of claim 1, wherein the second process gas comprises argon, helium, or a combination thereof.

3. The method of claim 1, wherein the third temperature is less 600° C.

4. The method of claim 1, wherein the ultra-violet light for the first operation of curing is a full spectrum ultra-violet light, and wherein the ultra-violet light for the second operation of curing is a full spectrum ultra-violet light.

5. The method of claim 1, wherein the ultra-violet light for the first operation of curing is a partial spectrum ultra-violet light with a wavelength in a range from about 300 nm to about 600 nm, and wherein the ultra-violet light for the second operation of curing is a partial spectrum ultra-violet light with a wavelength less than about 400 nm.

6. The method of claim 1, wherein the depositing the first flowable film over the substrate further comprises:
providing a silicon-containing precursor into the processing region; and
providing a nitrogen-containing precursor into the processing region, the nitrogen-containing precursor reacting with the silicon-containing precursor in the processing region to deposit the first flowable film over the substrate.

7. The method of claim 1, wherein the silicon oxide film consists essentially of silicon and oxygen.

8. The method of claim 1, wherein the substrate includes a semiconductor fin extending from the substrate, the silicon oxide film surrounding the semiconductor fin to form an isolation region.

9. A method comprising:
forming a semiconductor fin on a substrate;
forming an isolation region on the substrate, the isolation region surrounding the semiconductor fin, the forming the isolation region further comprising:
depositing a first flowable film over the substrate;
curing the first flowable film in a two operation curing process with both curing operations including ultra-violet light, the ultra-violet light for a first operation of curing being a partial spectrum ultra-violet light with a wavelength in a range from about 300 nm to about 600 nm, and the ultra-violet light for a second operation of curing being a partial spectrum ultra-violet light with a wavelength less than about 400 nm, and a second temperature for the second operation of curing being less than 100° C.; and
annealing the cured first flowable film at a first temperature to convert the cured first flowable film into the isolation region over the substrate.

10. The method of claim 9 further comprising:
forming a gate dielectric on a top surface and sidewalls of the semiconductor fin and a top surface of the isolation region; and
forming a gate electrode on the gate dielectric.

11. The method of claim 10 further comprising:
forming a source region and a drain region in the semiconductor fin, the gate electrode being interposed between the source region and the drain region;
forming an inter-layer dielectric over the gate electrode, the semiconductor fin, the source region, and the drain region, the forming the inter-layer dielectric further comprising:
depositing a second flowable film over the gate electrode, the semiconductor fin, the source region, and the drain region;
curing the second flowable film in a two operation curing process with both curing operations including ultra-violet light; and
annealing the cured second flowable film at the first temperature to convert the cured second flowable film into the inter-layer dielectric over the gate electrode, the semiconductor fin, the source region, and the drain region.

12. The method of claim 11, further comprising forming through the inter-layer dielectric to the source region and the drain region.

13. The method of claim 9, wherein the first temperature is less 600° C.

14. The method of claim 9, wherein a first operation of curing the first flowable film further comprises an oxygen-containing gas, and wherein a second operation of curing the first flowable film further comprises argon, helium, or a combination thereof.

15. The method of claim 9, wherein the annealing the cured first flowable film comprises a wet anneal process.

16. A method comprising:
forming a semiconductor fin on a substrate;
forming an isolation region on the substrate, the isolation region comprising a silicon oxide film and surrounding the semiconductor fin, the forming the isolation region further comprising:
depositing a first flowable film over a substrate, the first flowable film comprising silicon and nitrogen;
curing the first flowable film in a first operation at a curing temperature less than 100° C. with a first process gas and ultra-violet light, the first process gas comprising oxygen;
curing the first flowable film in a second operation at a curing temperature less than 100° C. with a second process gas and ultra-violet light, the second process gas comprising argon, helium, or a combination thereof; and
annealing the cured first flowable film at an annealing temperature less than less than 600° C. to convert the cured first flowable film into the silicon oxide film;
forming a gate dielectric on a top surface and sidewalls of the semiconductor fin and a top surface of the isolation region;
forming a gate electrode on the gate dielectric; and
forming a source region and a drain region in the semiconductor fin, the gate electrode being interposed between the source region and the drain region.

17. The method of claim 16, wherein the ultra-violet light for the first operation of curing is a full spectrum ultra-violet light, and wherein the ultra-violet light for the second operation of curing is a full spectrum ultra-violet light.

18. The method of claim 16, wherein the ultra-violet light for the first operation of curing is a partial spectrum ultra-violet light with a wavelength in a range from about 300 nm to about 600 nm, and wherein the ultra-violet light for the second operation of curing is a partial spectrum ultra-violet light with a wavelength less than about 400 nm.

19. The method of claim 16, wherein annealing the cured first flowable film is performed in a wet anneal process for a duration of about 1 hour to about 10 hours.

20. The method of claim 1, wherein the annealing the cured first flowable film comprises a wet anneal process.

* * * * *